United States Patent [19]
Manka et al.

[11] Patent Number: 6,001,715
[45] Date of Patent: *Dec. 14, 1999

[54] NON-THERMAL PROCESS FOR ANNEALING CRYSTALLINE MATERIALS

[75] Inventors: Charles Keith Manka, Alexandria, Va.; Jacob Grun, Silverspring, Md.; Billy Charles Covington; David William Donnelly, both of Huntsville, Tex.

[73] Assignee: The United States of America as represented by the Secretary of the Navy

[ * ] Notice: This patent issued on a continued prosecution application filed under 37 CFR 1.53(d), and is subject to the twenty year patent term provisions of 35 U.S.C. 154(a)(2).

[21] Appl. No.: 08/670,909

[22] Filed: Jun. 26, 1996

[51] Int. Cl.$^6$ ................................................. H01L 21/265
[52] U.S. Cl. ........................... 438/535; 438/512; 438/514
[58] Field of Search .................................... 438/797, 378, 438/473, 535, 690, 940, 487, 502, 509, 796, 512, 514; 117/4–10

[56] References Cited

U.S. PATENT DOCUMENTS

| | | | |
|---|---|---|---|
| 4,154,625 | 5/1979 | Golovchenko et al. | 148/1.5 |
| 5,623,307 | 4/1997 | Kotidis et al. | 356/351 |

OTHER PUBLICATIONS

Zdebskii, A.P., *Sov. Phys Acoust.* 35(6), Nov.–Dec. 1989, 651–652

Zdebskii et al., *Sov. Phys. Solid State* 29(4), Apr. 1987, 648–651.

Zdebskii et al., *Sov. Phys. Semicond.* 20(10), Oct. 1986, 1167–1170.

Zdebskii et al., *Sov. Tech. Phys. Lett.* 10(10) Oct. 1984, 525–527.

Galbov et al., *Sov. Tech Phys. Lett.* 10(5), May 1984, 260–261.

Zdebskii et al., *Sov. Tech Phys. Lett.* 12(1), Jan. 1986, 31–33.

Zdebskii et al., *Sov. Tech. Phys. Lett.* 13(8), Aug. 1987, 421–422.

Huang, Jiaming, *Laser Shock Annealing of Radiation Damaged Silicon*, Thesis, Sam Houston State University, Aug 1990.

Mu, Qi, *Laser Shock Annealing of Silicon:Boron Doped by Ion Implantation with Phosphorus*, Thesis, Sam Houston State University, Dec. 1991.

*Primary Examiner*—Savitri Mulpuri
*Attorney, Agent, or Firm*—Thomas E. McDonnell; Barry A. Edelberg

[57] ABSTRACT

Bulk crystalline materials are annealed by introducing into them mechanical energy of sufficient intensity to create a large amplitude sound wave. The mechanical energy may be introduced into the material, for example, by laser ablation. Where the bulk crystalline material is a doped semiconductor, the process also electrically activates the material.

13 Claims, 3 Drawing Sheets

NON-THERMAL PROCESS FOR ANNEALING CRYSTALLINE MATERIALS

BACKGROUND OF THE INVENTION

1. Field of the Invention

The present invention relates generally to the non-thermal annealing of crystalline materials, and more specifically to the mechanical annealing of crystalline materials.

2. Description of the Background Art

Semiconductor wafers must be annealed following ion implantation to activate dopants as well as to heal damage caused by ion bombardment. The thermal annealing procedures in use now tend to have detrimental side effects. For example, dopant diffusion smears the spatial sharpness of the vertical p-n junctions and degrades the lateral definition of device features. As is well known, implantation can significantly alter the transport properties of both extrinsic impurities and intrinsic defects, often increasing the diffusion coefficients by orders of magnitude. Segregation and gettering of the dopants are also known to occur during thermal annealing. Furthermore, undesirable impurities can be introduced from the surroundings and by diffusion from either the substrate or the top surface.

In some devices, thermal annealing is especially ineffective. An example is devices made from $Hg_{1-x}Cd_xTe$ which is the leading material for mid-wave and long-wave infrared detectors. Whereas the first $Hg_{1-x}Cd_xTe$ detectors were photoconductive, the drive toward 2D focal plane arrays (FPAs) with many discrete elements (e.g., 128×128) has led to the development of a second generation of pixelated photo-voltaic (PV) devices, which are bump-bonded to silicon CCDs for read-out and on-chip electronic processing. In order to achieve the required spatial patterning of N×N individual p-n junctions, many of the leading manufacturers currently employ a fabrication technology based on shallow-junction ion implantation. In the case of p-on-n photodiodes (presently the industry standard for most applications) arsenic or phosphorus ions are implanted into the top layer of the $Hg_{1-x}Cd_xTe$, which is initially undoped or lightly doped during epilayer growth.

It is universally found the $Hg_{1-x}Cd_xTe$ is n-type immediately following bombardment, independent of which dopant species is implanted. The first goal of the anneal is therefore to reduce the n-type background by healing damage and activating the P or As ions. Before annealing only 1 in about 1000 dopant ions occupies a normal lattice site. Ideally, one would prefer that all of the dopants occupy Te sites, where they become single acceptors. However, even following a successful thermal anneal, the activation efficiencies for both p-type and n-type implants in $Hg_{1-x}Cd_xTe$ tend to remain relatively low, typically about 10%.

A key feature of $Hg_{1-x}Cd_xTe$ is the exceptional extent to which its properties are governed not only by the presence of extrinsic impurities, but also by stoichiometry. Hg vacancies are by far the most common type of acceptor in unintentionally-doped material. During a thermal anneal, the vacancy concentration can either increase or decrease significantly, depending on whether a Hg overpressure is employed, but it rarely remains fixed. Other native defects, including the majority of those resulting from implantation damage, are known to produce donors. It should be emphasized that thermal annealing strongly influences both the concentrations and spatial distributions of both p-type and n-type stoichiometry-induced defects. Thus even apart from considerations of the impurity activation, thermal history plays a crucial role in governing the detector's electrical properties. It is this extreme sensitivity to stoichiometry that makes it so difficult to maintain fine control over the doping levels and spatial delineations of the p and n junction regions of a $Hg_{1-x}Cd_xTe$ photodiode. Although spatial redistribution of the implanted ions is much less of a concern when rapid thermal annealing (RTA) is employed, heat-induced changes in the concentration of stoichiometric dopants occur regardless of the time scale of the temperature increase. In particular, while it is often desirable to employ a light doping level in the undamaged n region of the device, type-conversion during the thermal anneal (even by RTA) makes it too difficult to maintain small net doping concentrations using conventional methods.

SIMOX is another example of a wafer that is difficult to anneal thermally. SIMOX is silicon with an insulating oxygen layer one micron below the surface. It is difficult to anneal thermally due to the loss of the thin layer during the thermal cycle. SIMOX is, therefore, an ideal candidate for mechanical annealing.

Mechanical energy may also be used to modify the physical properties of materials other than semiconductors. Examples include strain and stress relief, sintering of refractory materials, altering the magnetic properties of thin film surfaces, and the alteration of flux pinning in high temperature superconductors.

SUMMARY OF THE INVENTION

Accordingly, it is an object of this invention to non-thermally anneal crystalline materials.

It is another object of the present invention to anneal and electronically activate semiconductor devices doped by ion-implantation or neutron transmutation doping without degrading the definition of device features.

It is a further object of the present invention to anneal and electronically activate doped semiconductor devices without spatially redistributing the dopant.

These and additional objects of the invention are accomplished by mechanical energy annealing (MEA). MEA is accomplished by focusing, on or within an object doped by ion-implantation or neutron transmutation doping energy of sufficient intensity to launch a large amplitude sound wave having a sufficiently large amplitude to propagate throughout the object.

BRIEF DESCRIPTION OF THE DRAWINGS

A more complete appreciation of the invention will be readily obtained by reference to the following Description of the Preferred Embodiments, wherein:

FIG. 1(a) is the FTIR absorption spectrum of the unannealed, as implanted sample. FIG. 1(b) is the FTIR absorption spectrum of the sample after thermal anneal for 1 hr at 900° C. in nitrogen, and FIGS. 1(c) and 1(d) are the FTIR spectra of mechanical energy-annealed neutron-transmutation-doped samples. Integrated areas under the $2p_0$ line indicate comparable levels of activation in FIGS. 1(b) through FIGS. 1(d).

DESCRIPTION OF THE PREFERRED EMBODIMENTS

Figure 1A:
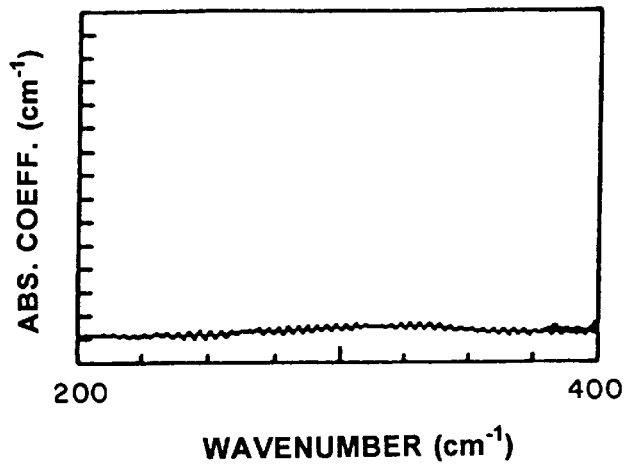
FIG. 1(a) through FIG. 1(d) are FTIR absorption spectra showing activation of P donors by MEA.
Figure 1B:
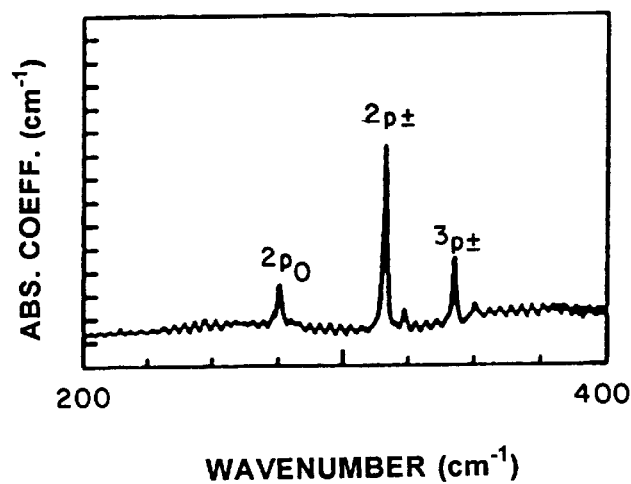
Figure 1C:
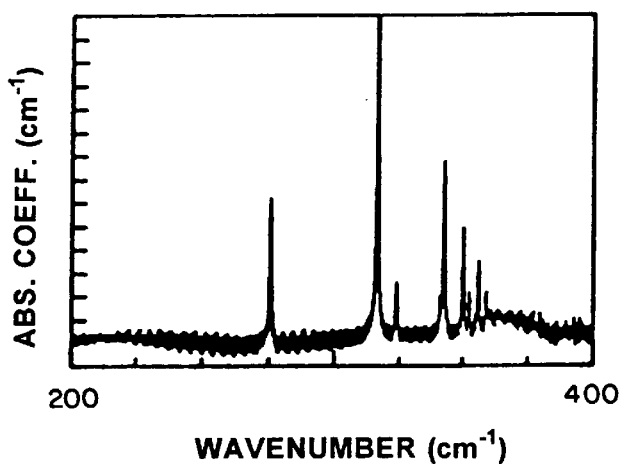
Figure 1D:
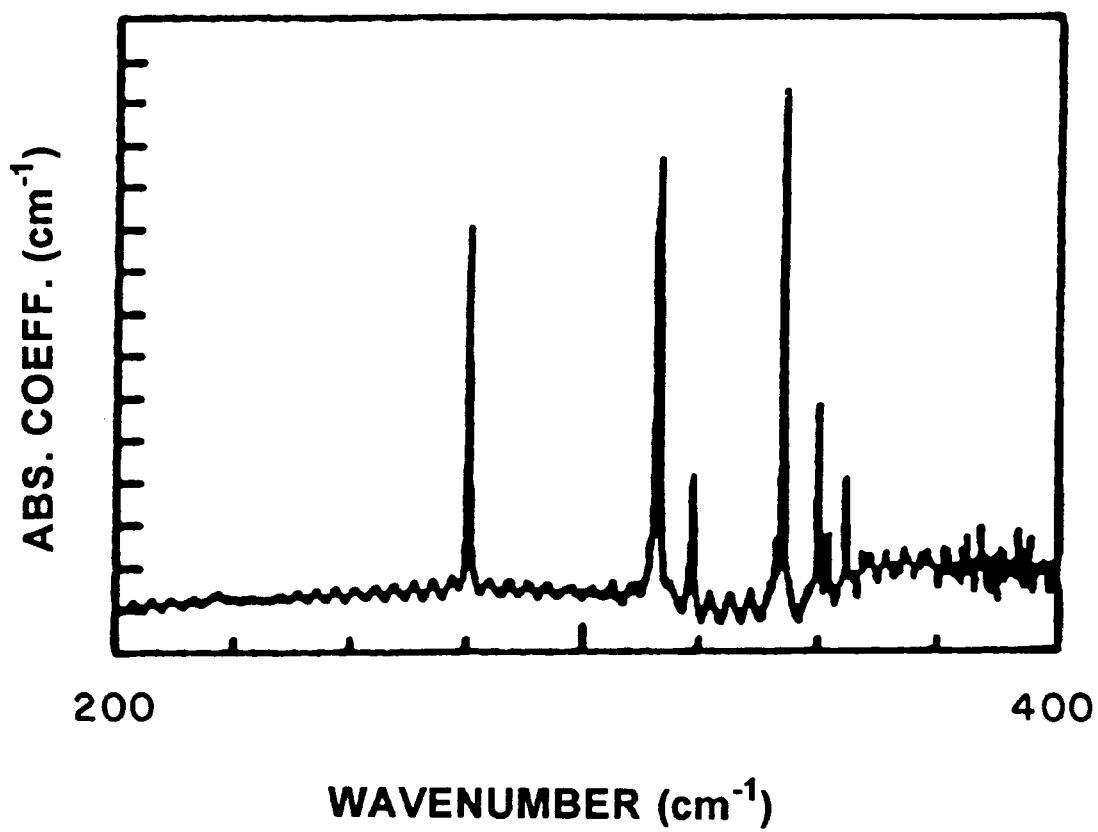

The method of the present invention may be used to anneal any crystalline material, including bulk materials, thin films (about 1 Å to about 100 $\mu$m), and thicker films. In the present specification and the claims that follow, the term anneal, unless otherwise explicitly or implicitly qualified, includes any alteration or refinement of the crystalline structure of a material, and particularly a refinement or alteration that significantly alters the mechanical or electrical properties of the crystalline material. The invention is particularly useful in the annealing of doped semiconductors, since the method of the present invention not only anneals out crystal defects, but also electronically activates dopants without the difficulties associated with thermal annealing processes.

Any doped semiconductor may be annealed and electronically activated according to the method of the present invention. Typical semiconductors that may be annealed according to the process of the present invention include, but are not limited to, neutron transmutation-doped Si, phosphorus-doped Si, boron-doped Si, and GaAs.

The source and type of mechanical energy introduced into the crystalline workpiece to be annealed does not appear to be critical, provided that the energy is sufficiently intense to launch a large amplitude sound wave that propagates throughout the portion of crystalline workpiece to be annealed. Generally, the portion of the workpiece into which the energy is directly introduced is destroyed. Thus, this energy should be directly introduced into significantly less than (less than 10%, typically less than 5%, and most often less than 1%) the total volume of the workpiece desired to be annealed. The energy may even be directly introduced, and is most favorably applied, into a small, even negligible, portion of the total volume of the workpiece to be annealed, provided that the energy is sufficiently intense to launch a large amplitude sound wave that propagates throughout the volume of the workpiece to be annealed. By introducing the energy into only a negligible portion of the volume of a workpiece, the functional characteristics of the workpiece are not significantly altered by the destruction at the site of energy introduction. Alternatively, energy may be introduced into a portion of the workpiece that is removed when annealing is complete. Limiting the direct application of energy to only a small volume of the workpiece limits the increased expense and effort that results from removal of the damaged portion of the workpiece.

Although the energy initially applied must be sufficiently intense to generate a large amplitude sound wave throughout the workpiece, the energy should not be so intense as to create cracks or other mechanical defects in portions of the workpiece significantly outside the volume of the workpiece directly exposed to the initially applied energy. The range of useful energy intensities that may be initially applied to a workpiece will vary depending upon the nature of the workpiece, but may be found empirically without undue experimentation. By way of example, when the large amplitude sound wave is generated by laser ablation of the workpiece, intensities greater than about $10^9$ W/cm$^2$ are typically used.

Conveniently, the energy may be introduced into the workpiece by focusing a high power (not necessarily high energy) laser onto the device. The laser generates a plasma that generates a shock wave. This shock wave degenerates into a large amplitude sound wave that propagates throughout and anneals the workpiece. By way of example, the laser energy applied is typically about 0.1–100 J, and more often about 1–10 J; the laser is typically operated at a wavelength of about 0.5–1.06 $\mu$m; and a laser pulse is typically applied for between less than a picosecond to about 100 ns. Other conditions and other methods of introducing mechanical energy into the workpiece may be employed.

The temperature during this annealing is not particularly critical, so long as the temperature of the bulk material remains is sufficiently low to avoid diffusion. Generally, the annealing process according to the present invention may be successfully performed at room temperature.

Where the energy initially coupled to the workpiece is from a laser, the laser is generally pulsed, to minimize heating of the workpiece. The degree of laser heating that a workpiece can withstand, without developing (in areas other than that directly exposed to the laser beam) structural defects that significantly and deleteriously alter the electrical characteristics of the workpiece, varies depending on the nature of the workpiece. Therefore, the best pulse rate and energy intensity are best found empirically for each substrate type without undue experimentation. The wavelength of the laser energy coupled to the workpiece is not critical, provided that the laser energy is sufficiently intense to generate a large amplitude sound wave that propagates throughout the workpiece, but insufficiently intense to crack the workpiece.

Having described the invention, the following examples are given to illustrate specific applications of the invention including the best mode now known to perform the invention. These specific examples are not intended to limit the scope of the invention described in this application.

EXAMPLES

To demonstrate mechanical-energy-annealing (MEA), ~25×~25×2 mm thick neutron-transmutation-doped (NTD) Si wafers doped to a concentration of $10^{15}$ cm$^{-3}$ were placed inside a vacuum chamber and irradiated by one or two pulses from a 1.06-$\mu$m wavelength, 5-ns FWHM duration, ~10 joule laser pulse focused to a 1-mm diameter spot on the wafer surface. (In the NTD process neutrons from a reactor irradiate an Si sample for 110 hours, transmuting $^{30}$Si to $^{31}$P. The neutron flux was measured to be 1E13 n/cm$^2$sec at 0.25–0.5 eV, and 6E11 n/cm$^2$sec at 0.5–10 eV, and modeled to be ~3E12 n/cm$^2$sec in the range of 10 eV to 1 MeV. The process created a uniform distribution of phosphorus through the entire wafer along with point defect densities several orders of magnitude higher than the donor concentration. The uniformity of the dopant distribution made these proof-of-principle experiments easier to diagnose and interpret.) After pulsed laser irradiation, the wafers were removed and analyzed for changes in carrier density, mobility, resistivity, and crystal structure as a function of position across the entire wafer, and particularly in areas far from the focal spot. Electrical measurements were made using a 4-point probe, an advanced Hall method, and far-infrared spectroscopy. Structural changes in the crystal-lattice were measured with x-ray diffraction, x-ray topography, and Raman spectroscopy. Unannealed and thermally annealed wafers were used as controls.

Far-infrared spectroscopy provided clear evidence for the activation of donor species by MEA. In this technique, the absorbance spectrum at 150–500 cm$^{-1}$ of a wafer cryogenically cooled to 5.5K was measured by a Fourier transform infrared spectrometer (FTIR). Electrically active donors are known to exhibit Lyman absorption lines at <800 cm$^{-1}$, whose strengths are proportional to the concentration of electrically active donors. FIG. 1(a) through FIG. 1(d) show the absorbance spectra of two MEA-processed wafers as well as those of thermally annealed and unannealed wafers. As expected, the spectrum of the unannealed wafer showed no Lyman lines because the phosphorus was not electrically active. In contrast, both MEA wafers showed distinctive P Lyman lines all the way up to 5p. The widths of the lines were on the order of 0.55 cm$^{-1}$ (0.07 mev), which was consistent with published measurements on thermally annealed NTD-Si with similar donor concentrations. The integrated area under the 2p$^\pm$ line at 316 cm$^{-1}$ was 15.4±1.0 cm$^{-2}$ for the two MEA-treated samples, and 18.5±0.5 cm$^{-2}$ for the thermally annealed, from which we estimate activated donor concentrations of 6.6±0.4×10$^{14}$ cm$^{-3}$ and 7.9±0.2×10$^{14}$ cm$^{-3}$ for the MEA and thermally annealed cases respectively.

Figure 2:
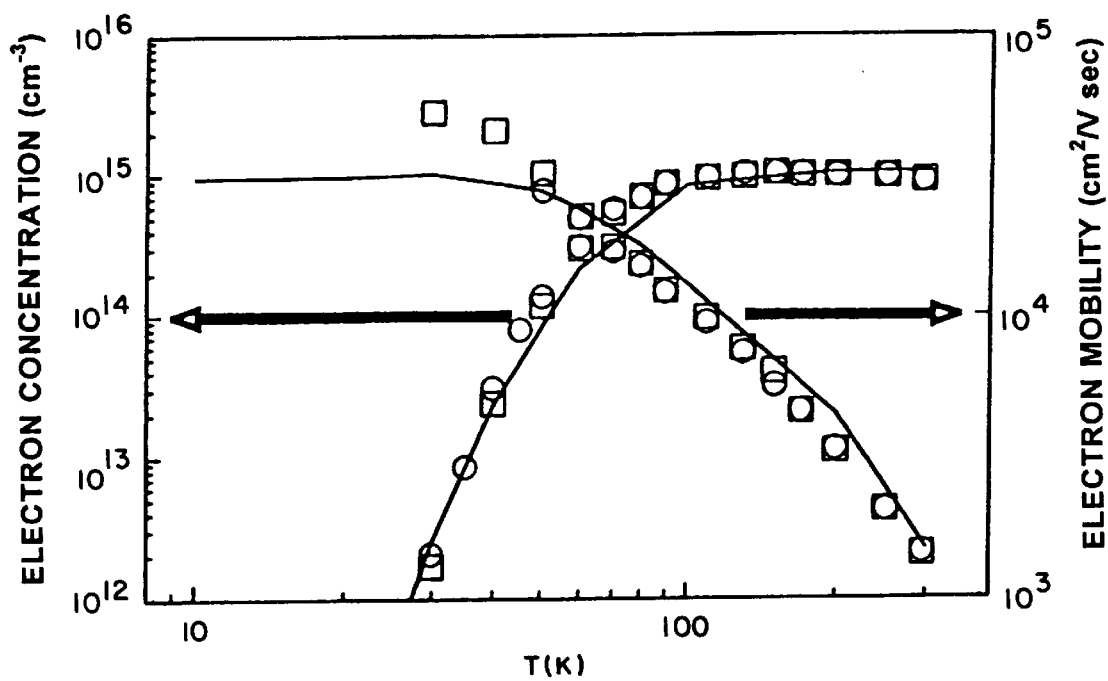
FIG. 2 show hall measurements confirming electrical activation of mechanical energy-annealed neutron-transmutation-doped Si:P wafers. The symbols ○ and □ refer to two different MEA wafers.

FIG. 2 shows the temperature dependence of the mobilities and carrier densities in the same two MEA samples. After MEA, a low temperature process was used to attach electrical leads to the corners of the wafers for Hall characterization using the Van der Pauw method. Measurements were performed at temperatures between 20K and 300K and at magnetic fields from 0 to 7 tesla. Analysis of the results, performed using the Quantitative Mobility Spectrum Analysis (QMSA) method, showed the presence of a single electron species whose concentration corresponds to 1.1×10$^{15}$cm$^{-3}$ activated donors. A fit of the standard freeze-out relation to the electron-concentration vs. temperature data implied a donor binding energy of 43 meV, which agrees well with published results for Si:P. The mobility agreed with theoretical predictions for thermally annealed, uncompensated n-type silicon, as well as with previous experimental results for comparably-doped melt-grown Si:P wafers which are thermally annealed during growth: At <40K, the MEA wafers had a slightly higher mobility, implying that the compensation may be somewhat less than in those previous experimental results. These results also demonstrated that MEA has removed the lattice damage to an extent that it has no detectable effect on the mobility.

Four-point probe measurements on the MEA samples showed that electrical activation was uniform, with no systematic position-dependent variation across either the front or back surfaces of the sample: In particular, resistivity near the wafer edges and corners, where shock reflections are expected to occur, were not measurably different from resistivities closer to the center of the wafer. The n-type sheet resistivity of 56±1 ohms/square compares with an n-type sheet resistivity of 130 ohms/square for a thermally annealed NTD wafer, p-type 1000 ohms/square for an undoped wafer, and an unmeasurably high sheet resistivity for an unannealed NTD wafer.

X-ray topographs and rocking curve measurements on unannealed NTD samples showed no differences from bulk Si, indicating that damage in the form of polycrystalline islands was not formed during the NTD process. The measurement did not rule out damage in the form of small regions of amorphous silicon or clusters of vacancies. No residual strain or excess dislocations were introduced by MEA in annealed regions far away from the focal spot. The unit cell parameter at 2 mm or more from the focal spot center was 5.430±0.002 angstroms, a value consistent with that of undamaged silicon. Closer to the focal spot the unit cell parameter increased to ~5.445 angstroms, indicating that the lattice was under a residual tensile strain of 0.2–0.3%.

Figure 3:
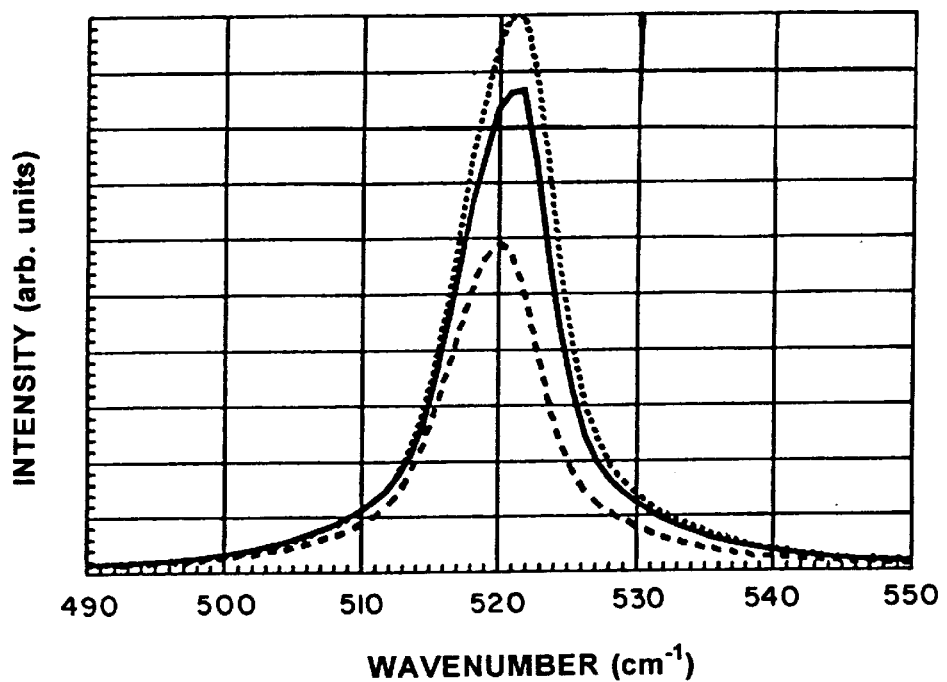
FIG. 3 shows the Raman spectra from Si wafers that were NTD-implanted, and the thermally annealed or mechanically annealed. The dashed line is the Raman spectrum of the as annealed NTD wafers. The dotted line is the Raman spectrum of the thermally annealed NTD wafers. The solid line is the Raman spectrum of the MEA NTD wafers.

Raman spectroscopy through the coupling of light to phonons can be a sensitive probe of material crystallinity, particularly in the case of polycrystalline or amorphous silicon. FIG. 3 shows Raman spectra for as-implanted, thermally annealed, and MEA-treated NTD samples. The thermally annealed and reference samples had a sharp longitudinal optic (LO) phonon mode at 521.0±0.2 cm$^{-1}$. A most noticeable effect of NTD implantation on this mode was a reduction in its peak intensity by ~2 everywhere on the front and back of the sample: Correlated with this is a slight red shift of 0.5±1 cm$^{-1}$. MEA blue-shifted the line back to 521 cm$^{-1}$ and its intensity recovered to within 10% of the thermally annealed samples. Since x-rays show no polycrystalline islands or strain, that could account for the reduction in Raman intensity and the red shift. However, Ishioka, et al. previously observed that in Si irradiated with low energy ions, the intensity of the 521 cm$^{-1}$ line was significantly reduced (but with no shift in energy). They correlated this effect with the formation of vacancies by low energy ions. Thus, the damage caused by the NTD process and removed by MEA was likely in the form of vacancies and vacancy clusters.

The annealing in our wafers was clearly mechanical because that is the only form of energy that could have traveled so far (~0.5") beyond the spot where the laser energy was deposited. The mechanism for launching mechanical energy into the wafer was as follows: At an irradiance of 3×10$^{11}$ watts/cm$^2$ within the 1-mm laser spot, ~100% of the laser energy was absorbed into 0.2 microns of the wafer through the process of inverse bremsstrahlung. Intense heating of this small amount of silicon creates ~200-eV plasma that expanded from the wafer surface with a speed of 200 km/sec. Like the exhaust of a rocket, the expanding plasma generated a pressure of 1.1×10$^{-10}$ (3×10$^{11}$ watts/cm$^2$)$^{0.8}$ Mbar≈0.2 Mbar, which drove a shock of the same pressure into the wafer interior. This shock advanced into the wafer at its full pressure for a distance equal to twice its speed times the laser pulse duration (≈0.5 mm), after which it is weakened by rarefaction waves from the focal spot and by geometrical expansion. Once the shock had traveled 1 cm, its pressure reduced to ~1/1000 of the original strength, but further decrease in its strength was gradual: By 5 cm, for example, the pressure may have been reduced by only another factor of 2. These pressure waves and accompanying rarefaction waves of equivalent strength rattled through the wafer until eventually they all decayed away. In contrast, the laser did not have sufficient energy to heat the entire sample significantly. Furthermore, it has been shown that temperature falls with distance r and time t approximately as $(\chi t)^{-3/2} \exp(-r^2/4\chi t)$ in spherical and $(\chi t)^{-1/2} \exp(-r^2/4\chi t)$ in planar geometry, where $\chi$~18 mm$^2$/sec. Since these are rapidly falling functions of r for all distances and times of interest (>mm, ns–msec), temperatures capable of annealing, i.e. 900° C., existed only near the edge of the laser spot. This is consistent with our observation that melting, which occurs at temperatures greater than 1414° C., existed only within the immediate neighborhood of the focal spot. Also, heating by radiation from the expanding plasma did not play a role since the back of the wafer, which was shielded from this radiation, was annealed as effectively as the front. Thus, mechanical energy is the only candidate to explain the observed activation.

Generally, shot-to-shot reproducibility has been about 29%. Shot-to-shot reproducablity can probably be significantly increased by improved control of the variables involved in MEA. While no comprehensive theory of MEA exists as yet, one can tentatively suggest that mechanical agitation initiates a cascade from the higher potential energy state of the implanted wafer to a lower potential energy state after annealing. In fact, it has been reported that amorphous to crystalline state transitions can be induced by a shock. But, MEA may benefit from more than the passage of a single shock, and other forms of mechanical energy subsequent to the shock may be useful. If so, the efficiency of annealing may be related to variables such as lattice orientation, wafer shape, method of wafer support, and details of shock launching.

In conclusion, the examples demonstrated experimentally that semiconductor wafers can be efficiently and uniformly annealed using mechanical energy instead of thermal energy. The electrical characteristics of the best MEA wafers were indistinguishable from those of thermally annealed wafers and exhibit nearly the same degree of lattice healing. But, because no heat is involved and the process is very rapid, MEA is expected to be free of the diffusion that limits the definition attainable with thermal annealing. This new technique can potentially enable the production of the next generation of low power, high density semiconductor devices.

Obviously, many modifications and variations of the present invention are possible in light of the above teachings. It is therefore to be understood that, within the scope of the appended claims, the invention may be practiced otherwise than as specifically described.

What is claimed is:

1. A method of mechanically annealing and electrically activating a volume of a crystalline semiconductor doped by implantation, comprising the step of forming an ablation plasma on a surface of said doped crystalline semiconductor by focusing energy onto a spot on said surface so as to launch into said volume of said doped crystalline semiconductor outside said spot a sound wave of sufficient intensity to propagate within, mechanically anneal, and electrically activate said volume while temperatures within said mechanically annealed and electrically activated volume remain below a thermal annealing temperature of said doped crystalline semiconductor.

2. The method of claim 1, wherein said step of forming an ablation plasma damages only said spot.

3. The method of claim 1, wherein said ablation plasma is formed by focusing a laser beam on said spot.

4. The method of claim 3, wherein said spot on said surface of said doped crystalline semiconductor is irradiated with laser energy of about 0.1 J–100 J.

5. The method of claim 4, wherein said spot on said surface of said doped crystalline semiconductor is irradiated with laser energy of about 1 J–10 J.

6. The method of claim 3, wherein said laser beam has an intensity of greater than about $10^9$ W/cm$^2$.

7. The method of claim 3, wherein said laser beam has a wavelength of about 0.5–1.06 µm.

8. The method of claim 3, wherein said laser beam is in the form of at least one pulse having a pulse duration of less than about 100 ns.

9. The method of claim 6, wherein said doped crystalline semiconductor is selected from the group consisting of neutron transmutation-doped Si, Si doped by ion implantation with phosphorus, Si doped by ion implantation with boron, and GaAs.

10. The method of claim 1, wherein said step of forming of an ablation plasma damages about 5% or less of said volume of said doped crystalline semiconductor.

11. The method of claim 10, wherein said step of forming an ablation plasma damages about 1% or less of said volume of said doped crystalline semiconductor.

12. The method of claim 1, wherein said doped crystalline semiconductor is a bulk material or a coating.

13. A method of repairing lattice damage within, and electrically activating, a volume of doped crystalline semiconductor doped by ion implantation or neutron transmutation doping, comprising the step of focusing energy onto a spot on a surface of said volume of said doped crystalline semiconductor so as to initiate at said spot a shock wave that degenerates into a sound wave of sufficient intensity to repair said lattice damage throughout, and electrically activate, said volume of said doped crystalline semiconductor outside said spot while temperatures within said repaired volume remain below a thermal annealing temperature of said doped crystalline semiconductor.

* * * * *